(12) United States Patent
Jiang

(10) Patent No.: US 10,756,125 B2
(45) Date of Patent: Aug. 25, 2020

(54) FLEXIBLE DISPLAY PANEL AND METHOD FOR BENDING A GOA REGION THEREOF

(71) Applicant: Wuhan China Star Optoelectronics Technology Co., Ltd., Wuhan, Hubei (CN)

(72) Inventor: Guoqiang Jiang, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 208 days.

(21) Appl. No.: 15/745,117

(22) PCT Filed: Nov. 29, 2017

(86) PCT No.: PCT/CN2017/113526
§ 371 (c)(1),
(2) Date: Jan. 15, 2018

(87) PCT Pub. No.: WO2019/056574
PCT Pub. Date: Mar. 28, 2019

(65) Prior Publication Data
US 2019/0386041 A1    Dec. 19, 2019

(30) Foreign Application Priority Data

Sep. 19, 2017 (CN) ............................ 2017 1 0847226

(51) Int. Cl.
*H01L 29/06* (2006.01)
*H01L 27/12* (2006.01)
*H01L 51/00* (2006.01)

(52) U.S. Cl.
CPC ...... *H01L 27/1262* (2013.01); *H01L 27/1218* (2013.01); *H01L 51/0097* (2013.01)

(58) Field of Classification Search
CPC combination set(s) only.
See application file for complete search history.

(56) References Cited

U.S. PATENT DOCUMENTS

| | | | |
|---|---|---|---|
| 2016/0211450 A1* | 7/2016 | Song | H01L 27/3262 |
| 2016/0254286 A1* | 9/2016 | Song | H01L 23/5386 257/91 |

FOREIGN PATENT DOCUMENTS

| | | |
|---|---|---|
| CN | 106058074 | 10/2016 |
| CN | 106782122 | 5/2017 |

* cited by examiner

*Primary Examiner* — Robert G Bachner
(74) *Attorney, Agent, or Firm* — Hemisphere Law, PLLC; Zhigang Ma

(57) ABSTRACT

A method for bending a GOA region of a flexible display panel is disclosed. The flexible display panel includes a substrate with an edge having a GOA bendable region. The method includes: an inflating assembly adheres to the GOA bendable region and a serving motor drives the inflating assembly to rotate and bend the GOA bendable region to the back surface of the substrate; and the inflating assembly inflates to press the GOA bendable region against the back surface of the substrate. A flexible display panel using the abovementioned method is also disclosed.

7 Claims, 2 Drawing Sheets

FLEXIBLE DISPLAY PANEL AND METHOD FOR BENDING A GOA REGION THEREOF

RELATED APPLICATIONS

The present application is a National Phase of International Application Number PCT/CN2017/113526, filed Nov. 29, 2017, and claims the priority of China Application 201710847226.9, filed Sep. 19, 2017.

FIELD OF THE DISCLOSURE

The disclosure relates to a display panel technical field, and more particularly to a flexible display panel and a method for bending a GOA region thereof.

BACKGROUND

With the maturity of the flexible OLED display technology, the type of flexible display products endlessly varies. Nowadays, borderless display products have been become the mainstream in the market. Thus, the borderless display products have higher demands for their fabrication process. The gate driver on array (GOA) bending technology is one of the important technologies for borderless display products.

The conventional GOA bending: The GOA region of a flexible OLED display panel is bended and attached to the back surface of the panel. However, the technology that can achieve full-screen display effect related to long edges has some technical drawbacks. For example, the GOA region is very narrow (about 5 mm). Although a bending device bends the GOA region in a vacuum-absorbing way, the stability of bending the GOA region is difficultly guaranteed. On top of that, the conventional method presses a curved surface, which difficultly ensures the attaching effect but easily causes the risk for fragments.

SUMMARY

A technical problem to be solved by the disclosure is to provide a flexible display panel and a method for bending a GOA region thereof, which improves the stability of bending a GOA region, the reliability of pressing a curved surface, the assembling efficiency, and the yield of products.

An objective of the disclosure is achieved by following embodiments. In particular, a flexible display panel and a method for bending a GOA region thereof is provided. The flexible display panel comprises a substrate with an edge having a GOA bendable region. The method comprises: adhering an inflating assembly to the GOA bendable region and driving the inflating assembly to rotate and bend the GOA bendable region to the back surface of the substrate by a serving motor; and inflating the assembly inflating to press the GOA bendable region against the back surface of the substrate.

In an embodiment of the present invention, the GOA bendable region adheres to the inflating assembly, and the serving motor rotates and bends the inflating assembly with a bending line as a rotating axis; after the GOA bendable region is bent and moved to a position, the inflating assembly inflates to press-adhere the GOA bendable region against the back surface of the substrate.

In an embodiment of the present invention, the inflating assembly is a gasbag.

In an embodiment of the present invention, the gasbag press-adheres the GOA bendable region in a curved surface manner.

In an embodiment of the present invention, the inflating assembly is a gasbag.

In an embodiment of the present invention, the gasbag press-adheres the GOA bendable region in a curved surface manner.

In order to overcome the abovementioned problem, the present invention also provides a method for bending a GOA region of a flexible display panel, which comprises: a gasbag adhering to a GOA bendable region of a flexible display panel and a bending device fixed to the gasbag driving the gasbag to rotate and bend the GOA bendable region; and the gasbag inflating to press-adheres the GOA bendable region in a curved surface manner.

In order to overcome the abovementioned problem, the present invention also provides a flexible display panel, which comprises: a substrate with an edge having a GOA bendable region, and the GOA bendable region is curved and pressed against the back surface of the substrate.

The flexible display panel and the method for bending the GOA region thereof of the present invention have advantages described as follows.

Firstly, the inflating assembly adheres to the GOA bendable region, and the GOA bendable region is bent to the back surface of the substrate. The inflating assembly inflates to press the GOA bendable region against the back surface of the substrate, thereby improving the stability of bending the GOA region and the reliability of pressing the curved surface.

Secondly, the fabrication process is simplified. Based on improving the assembling efficiency and the production yield, the cost is reduced.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

Figure 1:
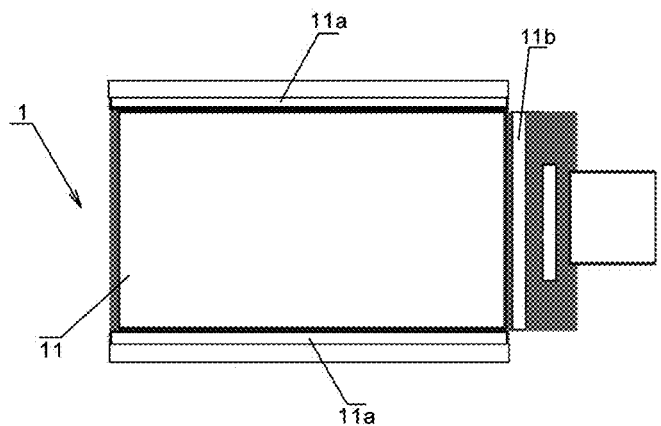
FIG. 1 is a schematic view of a flexible display panel according to an embodiment of the disclosure.
Figure 2:
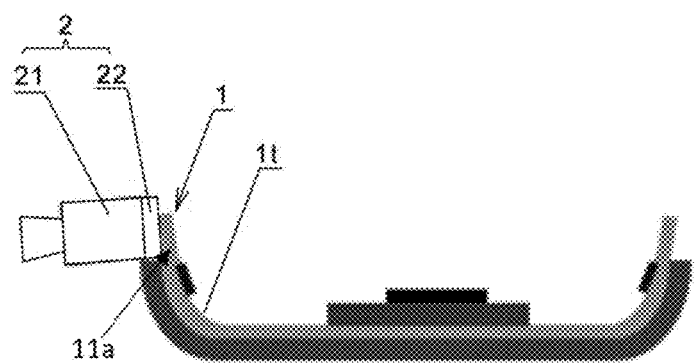
FIG. 2 is a schematic view of an inflating assembly adhering to a GOA bendable region when bending the GOA bendable region of a flexible display panel according to an embodiment of the disclosure.
Figure 3:
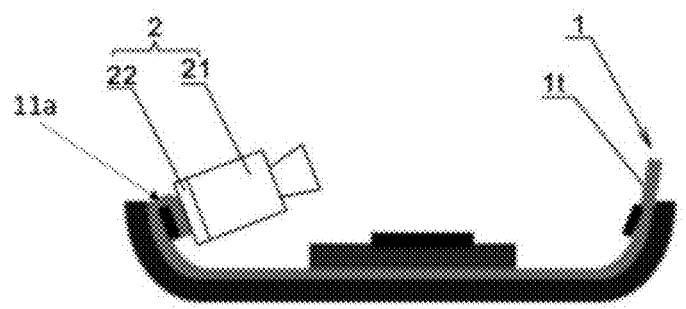
FIG. 3 is a schematic view of a GOA bendable region bent to the back surface of a substrate when bending the GOA bendable region of a flexible display panel according to an embodiment of the disclosure.
Figure 4:
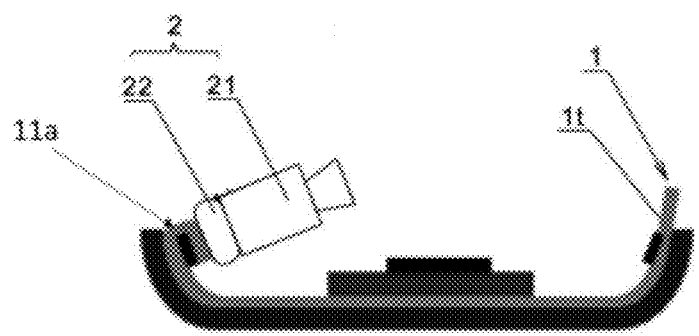
FIG. 4 is a schematic view of inflating an inflating assembly to press a GOA bendable region against the back surface of a substrate when bending the GOA bendable region of a flexible display panel according to an embodiment of the disclosure.

Refer to FIGS.1-4. The first embodiment of the method for bending the GOA region of a flexible display panel of the present invention is introduced.

The flexible display panel 1 comprises a substrate 11 with edges having GOA bendable regions 11a. The GOA bendable regions 11a are two opposite long edges that are long and narrow. In other embodiments, the GOA bendable regions 11a are adaptable according to the type of the flexible display panel. In the embodiment, the substrate 11 has a short edge being a PAD bending region 11b between the two GOA bendable regions 11a. After bending the two GOA bendable regions 11a, the PAD bending region 11b is bent to connect to a flexible printed circuit (FPC) board.

Furthermore, the method for bending the GOA region of the flexible display panel comprises:

An inflating assembly 2 adheres to the GOA bendable region 11a and a serving motor drives the inflating assembly 2 to rotate and bend the GOA bendable region 11a to the back surface 1t of the substrate 1. The inflating assembly 2 inflates to press the GOA bendable region 11a against the back surface 1t of the substrate 1.

Specifically, the inflating assembly 2 includes a bending device 21 and an inflating assembly 22 fixed to the bending device 21. The bending device 21 drives the inflating assembly 22 to rotate and bend. Specifically, the GOA bendable region adheres to the inflating assembly. The serving motor rotates and bends the inflating assembly with a bending line being a rotating axis. After the GOA bendable region is bent and moved to a position, the inflating assembly inflates to press the GOA bendable region against the back surface of the substrate. In the embodiment, the bending device 21 has hardness. With a center being an axle center, the bending device 21 rotates the inflating assembly 22 and the GOA bendable region 11a adhering to the inflating assembly 22 to bend the GOA bendable region 11a.

Furthermore, the inflating assembly 22 has stickiness and adheres to the GOA bendable region 11a. Besides, the inflating assembly 22 can inflate. In the embodiment, the inflating assembly 22 is a gasbag made of soft material with high strength.

Specifically, the gasbag 22 is inflated through an inside gas hole. When the air pressure of the gasbag 22 reaches a given value, the gasbag 22 is not inflated for 2 seconds (the GOA region has been attached to the back surface of the product). In this way, when the gasbag inflates to press and curve the GOA bendable region 11a, such that the GOA bendable region 11a is bent and pressed against the back surface 1t of the substrate.

The bending device 21 is provided with the inflating assembly 22 with stickiness to perform the following functions: the inflating assembly 22 with stickiness does not separate from the GOA bendable region 11a during a bending process. In addition, after the bending device 21 rotates and moves the inflating assembly 22 and the GOA bendable region 11a adhering to the inflating assembly 22 to the corresponding position of back surface 1t of the substrate, the bending device 21 curves and presses the GOA bendable region 11a to guarantee that the pressure uniformly increases, thereby ensuring the adhesive effect.

In the method for bending the GOA region of the flexible display panel, a gasbag adheres to a GOA bendable region 11a of a flexible display panel. Specifically, two symmetrical gasbags with the same structures respectively adhere to the GOA bendable regions of two opposite long edges 11a of the substrate 11. Next, the bending devices 21 drive the gasbags to rotate and bend the GOA bendable regions. The gasbags inflate to curve and press the GOA bendable regions 11a.

Furthermore, the present invention provides a flexible display panel using the method for bending the GOA region of the flexible display panel. For the flexible display panel, the fabrication process is simplified. Based on improving the assembling efficiency and the production yield, the cost is reduced.

The flexible display panel and the method for bending the gate driver on array (GOA) region thereof of the present invention have advantages described as follows.

Firstly, the inflating assembly adheres to the GOA bendable region, and the GOA bendable region is bent to the back surface of the substrate. The inflating assembly inflates to press the GOA bendable region against the back surface of the substrate, thereby improving the stability of bending the GOA region and the reliability of pressing the curved surface.

Secondly, the fabrication process is simplified. Based on improving the assembling efficiency and the production yield, the cost is reduced.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A method for bending a Gate Driver On Array (GOA) region of a flexible display panel, the flexible display panel comprising a substrate and a GOA bendable region disposed on an edge of the substrate, the method comprising:
   adhering an inflating assembly to the GOA bendable region and a driving the inflating assembly to rotate and bend the GOA bendable region to a back surface of the substrate by a serving motor; and
   inflating the inflating assembly to press the GOA bendable region against the back surface of the substrate.

2. The method for bending the GOA region of the flexible display panel according to claim 1, wherein the GOA bendable region adheres to the inflating assembly, and the serving motor rotates and bends the inflating assembly with a bending line as a rotating axis; after the GOA bendable region is bent and moved to a position, the inflating assembly inflates to press-adhere the GOA bendable region against the back surface of the substrate.

3. The method for bending the GOA region of the flexible display panel according to claim 1, wherein the inflating assembly is a gasbag.

4. The method for bending the GOA region of the flexible display panel according to claim 3, wherein the gasbag press-adheres the GOA bendable region in a curved surface manner.

5. The method for bending the GOA region of the flexible display panel according to claim 2, wherein the inflating assembly is a gasbag.

6. The method for bending the GOA region of the flexible display panel according to claim 5, wherein the gasbag curves and presses the GOA bendable region.

7. A method for bending a Gate Driver On Array (GOA) region of a flexible display panel comprising:
   adhering a gasbag to a GOA bendable region of a flexible display panel, and fixing a bending device to the gasbag driving the gasbag to rotate and bend the GOA bendable region; and
   inflating the gasbag to curve and press the GOA bendable region.

\* \* \* \* \*